United States Patent [19]
Deaton et al.

[11] Patent Number: 5,737,715
[45] Date of Patent: Apr. 7, 1998

[54] FREQUENCY NORMALIZATION UTILIZING GPS PULSE TIME AND TIME INTERVAL SIGNAL

[75] Inventors: Robert A. Deaton, Los Angeles; Rick J. Lioio, Redondo Beach, both of Calif.

[73] Assignee: Hughes Electronics, Los Angeles, Calif.

[21] Appl. No.: 636,290

[22] Filed: Apr. 23, 1996

[51] Int. Cl.$^6$ .................................................. H04B 7/185
[52] U.S. Cl. .................................. 701/213; 455/12.1
[58] Field of Search .................................. 364/459, 460, 364/449.7; 455/12.1, 13.3; 235/61 NV; 342/361, 362; 375/206; 701/213

[56] References Cited

U.S. PATENT DOCUMENTS

| | | | |
|---|---|---|---|
| 5,101,416 | 3/1992 | Fentou et al. | 375/206 |
| 5,347,285 | 9/1994 | MacDorau et al. | 342/357 |

*Primary Examiner*—Emanuel T. Voeltz
*Assistant Examiner*—Thomas Peeso
*Attorney, Agent, or Firm*—Leonard A. Alkov; Wanda K. Denson-Low

[57] ABSTRACT

A local oscillator frequency measurement system for measuring the frequency of a local oscillator of an ESM receiver. The frequency measurement system includes a global positioning system (GPS) receiver (20) for providing a GPS pulse time and time interval signal; a threshold detector (45) responsive to the GPS pulse time and time interval signal for detecting pulses in the GPS pulse time and time interval signal for providing an output indicative of the occurrences of the pulses; a counter (41) clocked by the output of the local oscillator for providing a counter output; a latch (43) for sampling the counter output pursuant to detection of the pulses to provide sampled counts, whereby the sampled counts represent the outputs of the counter at the time the pulses are detected; and a processor (50) for processing the sampled counts to determine the frequency of the local oscillator.

1 Claim, 1 Drawing Sheet

FREQUENCY NORMALIZATION UTILIZING GPS PULSE TIME AND TIME INTERVAL SIGNAL

BACKGROUND OF THE INVENTION

The disclosed invention is directed generally to electronic support measures (ESM) receivers, and more particularly to an ESM receiver that measures its local oscillator frequency by reference to a global positioning system (GPS) time reference.

ESM receivers utilize a local oscillator (LO) frequency to measure the frequency and/or time of arrival of received RF signals. For example, passive location of an RF emitter may be performed rapidly and accurately by comparing RF signal measurements made by ESM receivers aboard multiple aircraft. These signal measurements can be in time or frequency domain or both. The comparison of the RF signal measurements requires the use of a common time and frequency reference.

A significant consideration with the use of a local oscillator frequency in an ESM receiver is local oscillator drift wherein the local oscillator frequency changes with time and possibly environmental factors. Error in the local oscillator frequency results in error in the detected frequency and/or time of arrival measurements.

A known technique for dealing with local oscillator drift is to use a highly stable clock as a reference. However, a highly stable clock is expensive.

SUMMARY OF THE INVENTION

It would therefore be an advantage to provide an ESM receiver that efficiently provides a measurement of a local oscillator frequency.

The foregoing and other advantages are provided by the invention in a local oscillator frequency measurement system that includes a global positioning system (GPS) receiver for providing a GPS pulse time and time interval signal; a threshold detector responsive to the GPS pulse time and time interval signal for detecting pulses in the GPS pulse time and time interval signal and for providing an output indicative of the occurrences of the GPS pulses; a counter clocked by the output of a local oscillator for providing a counter output; a sampling circuit for sampling the counter output pursuant to detection of the GPS pulses to provide sampled counts, whereby the sampled counts represent the outputs of the counter at the time the GPS pulses are detected; and a processor for processing the sampled counts to determine the frequency of the local oscillator.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
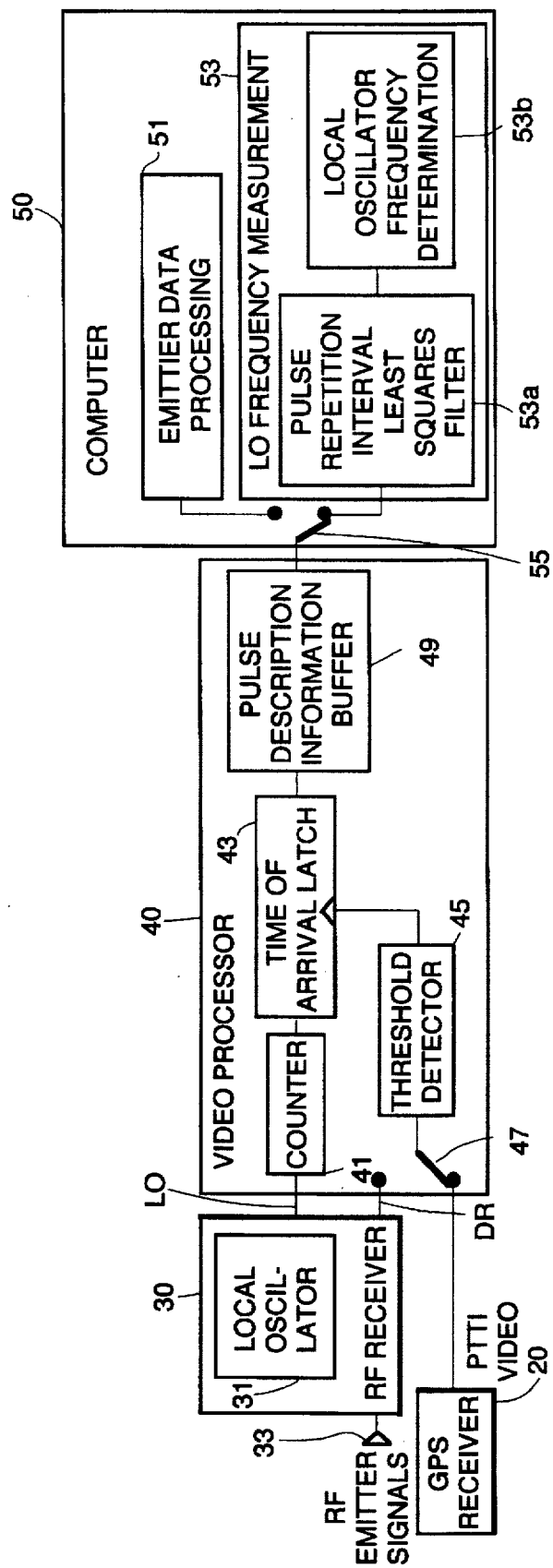
FIG. 1 is a block diagram of an ESM receiver that incorporates a local oscillator frequency measurement system in accordance with the invention.

In the following detailed description and in the several figures of the drawing, like elements are identified with like reference numerals.

Referring now to FIG. 1, schematically set forth therein is an ESM receiver that incorporates a local oscillator frequency measurement system in accordance with the invention, and which broadly includes a global positioning system (GPS) receiver 20, an RF receiver 30, a video processor 40 which is responsive to the video or baseband outputs of the GPS receiver 20 and the RF receiver 30, and a computer 50 for processing the output of the video processor 40.

The GPS receiver 20 is responsive to the GPS signals provided by GPS satellites, and provides to the video processor a Precision Time and Time Interval (PTTI) video signal in a conventional manner. The PTTI video signal essentially comprises a one pulse per second signal that is precisely referenced to an atomic clock.

The RF receiver 30 is a conventional RF receiver that includes a local oscillator 31 which generates a local oscillator output LO that is utilized to down convert RF emitter signals received via an antenna 33 to provide a receiver down converted baseband output DR. The LO output of the local oscillator 31 and baseband output DR of the RF receiver 30 are provided to the video processor 40.

The video processor 40 includes a counter 41 which is clocked by the LO output of the local oscillator 31 of the RF receiver 30. The output of the counter 41 is provided to a time of arrival latch 43 which is controlled by the output of a threshold detector 45. The input to the threshold detector 45 is provided by a switch 47 which is controllably switched between the baseband DR output of the RF receiver 30 and the PTTI video output of the GPS receiver 20. Thus, the input to the threshold detector 45 is either the baseband output DR of the RF receiver 30 or the PTTI video output of the GPS receiver 20, depending on the position of the switch 47. The counter outputs sampled by the time of arrival latch 43 are buffered in a pulse description information buffer 49 with other information generated by the RF receiver 30 and video processor 40 regarding the RF signals received by the RF receiver 30.

The computer 50 implements an emitter data processing module 51 and an LO frequency measurement module 53 which receives data from the pulse description information buffer 49 via a switch 55. The switch 53 is controlled such that the emitter data processing module 51 receives buffered data that is pertinent to the RF signals received by the RF receiver 30, and the LO frequency measurement module 55 receives the buffered outputs of the time of arrival latch which were latched pursuant to the detected pulses of the PTTI video signal.

In accordance with the invention, the video processor switch 47 is controlled to intercept PTTI video at a once per second rate such that the PTTI pulses are provided to the threshold detector 45. Since the PTTI video signal comprises a one pulse per second signal, the outputs of the counter 41 that are sampled by the latch 43 represent counts that are separated by one second. The difference between adjacent count samples, as appropriately calculated to account for counter roll-over, is equal to the number of cycles of the local oscillator output that occurred in the one second time interval between the PTTI pulses that sampled such adjacent samples. Such differences or pulse repetition intervals are filtered by a pulse repetition interval least squares filter 53a of the LO measurement module 53 to reduce quantization error. The output of the pulse repetition interval least squares filter 53a essentially comprises a long term average pulse repetition interval and is provided to a local oscillator frequency determination unit 53b of the LO measurement module 53 which determines the frequency of the local oscillator 31 of the RF receiver. In particular, since the pulse repetition interval represents the number of cycles of the local oscillator output that occur in one second, the local oscillator frequency is equal to the reciprocal of the filtered pulse repetition interval. Current time is readily tracked by accumulating the differences between adjacent samples, as appropriately adjusted for counter roll-over, whereby the current time is accumulated beyond the maximum count of the time of arrival counter 41.

The measured local oscillator frequency and the PTTI time reference can be used to synchronize RF emitter time and frequency measurements made by ESM receivers aboard multiple aircraft, and can also be used to calibrate local oscillator drift of a single ESM receiver.

The foregoing has thus been a disclosure of an ESM receiver that efficiently provides a measurement of a local oscillator frequency.

Although the foregoing has been a description and illustration of specific embodiments of the invention, various modifications and changes thereto can be made by persons skilled in the art without departing from the scope and spirit of the invention as defined by the following claims.

What is claimed is:

1. An ESM receiver, comprising:

an RF receiver for receiving RF emitter signals and providing a receiver downconverted output signal representing received emitter signals, said receiver including a local oscillator;

counting means clocked by the output of the local oscillator for providing a counting means output;

a time-of-arrival latch for sampling the counting means output in response to a latch control signal;

a global positioning system (GPS) receiver for providing a GPS precision pulse time and time interval signal;

a switch which is controllably switched between said receiver output signal and said GPS signal, wherein a switch output signal represents either said receiver output signal or said GPS signal, the switch controlled to intercept said GPS signal at a predetermined periodic rate;

detection means responsive to said switch output for detecting pulses in said GPS pulse time and time interval signal when switched to said GPS signal for providing an output indicative of the occurrences of said GPS pulses, and for detecting pulses in said receiver output signal, wherein the detection means provides as an output said latch control signal, whereby said sampling occurs in response to pulses in said GPS pulse time and time interval signal on precisely determined time intervals to provide sampled counts represent the outputs of said counting means at the time said GPS pulses are detected, and said sampling occurs in response to pulses in said RF receiver output signal when the switch is connected to the RF receiver output signal;

a pulse description information buffer for buffering counter outputs sampled by the time-of-arrival latch;

a receiver computer comprising an emitter data processing module for receiving and processing information pertinent to the RF emitter signals received by the RF receiver, and a local oscillator frequency measurement module responsive to buffered outputs of the time-of-arrival latch which represent sampled counts of the counter and which were sampled pursuant to the detected GPS signal pulses, the local oscillator frequency measurement module comprising means for processing said sampled counts to determine the frequency of the local oscillator.

* * * * *